(12) United States Patent
Iimura et al.

(10) Patent No.: US 10,768,525 B2
(45) Date of Patent: Sep. 8, 2020

(54) IMPRINT APPARATUS AND ARTICLE MANUFACTURING METHOD

(71) Applicant: CANON KABUSHIKI KAISHA, Tokyo (JP)

(72) Inventors: Akiko Iimura, Utsunomiya (JP); Toshiki Ito, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 492 days.

(21) Appl. No.: 15/422,498

(22) Filed: Feb. 2, 2017

(65) Prior Publication Data

US 2017/0232645 A1 Aug. 17, 2017

(30) Foreign Application Priority Data

Feb. 12, 2016 (JP) .................. 2016-025202

(51) Int. Cl.
*G03F 7/00* (2006.01)

(52) U.S. Cl.
CPC .................. *G03F 7/0002* (2013.01)

(58) Field of Classification Search
None
See application file for complete search history.

(56) References Cited

U.S. PATENT DOCUMENTS

| | | |
|---|---|---|
| 9,437,414 B2 | 9/2016 | Ota |
| 2002/0123003 A1 | 9/2002 | Kannurpatti |
| 2003/0031802 A1 | 2/2003 | Weiss |
| 2005/0037143 A1* | 2/2005 | Chou .................. B29C 43/021 427/248.1 |
| 2009/0085255 A1 | 4/2009 | Tada |

(Continued)

FOREIGN PATENT DOCUMENTS

| | | |
|---|---|---|
| CN | 1832846 A | 9/2006 |
| CN | 102203671 A | 9/2011 |

(Continued)

OTHER PUBLICATIONS

Basis and Practical Use of Photosensitive Resin, CMC, supervised by Kiyoshi Akamatsu, pp. 242-243.*
Office Action issued in Japanese Patent Application No. 2016-025202 dated Aug. 28, 2017.
"Technology of UV/EB Curing", Japan, United Engineering Center Co., Ltd., Oct. 10, 1982, pp. 160-161. Cited in NPL 1.

(Continued)

*Primary Examiner* — Michael P. Rodriguez
(74) *Attorney, Agent, or Firm* — Rossi, Kimms & McDowell LLP

(57) ABSTRACT

An imprint apparatus forms a pattern by curing a radical polymerizable imprint material by irradiating the imprint material with light in a state in which a mold is brought into contact with the imprint material. The apparatus includes an irradiator configured to irradiate the imprint material with light, and a controller configured to control the irradiator. Letting $I_c$ be an illuminance of the light with which the imprint material is irradiated, $t_c$ be a time during which the imprint material is irradiated with the light, k be a coefficient, and PD be a target degree of photopolymerization of the imprint material subjected to irradiation with the light, the controller determines the irradiation time in accordance with: $PD = k \times (\sqrt{I_c}) \times t_c$.

44 Claims, 5 Drawing Sheets

(56) References Cited

U.S. PATENT DOCUMENTS

| | | | |
|---|---|---|---|
| 2010/0102469 A1* | 4/2010 | Khusnatdinov | B82Y 10/00 264/40.1 |
| 2011/0076353 A1 | 3/2011 | Shirai et al. | |
| 2012/0080825 A1* | 4/2012 | Mitsui | B82Y 10/00 264/447 |
| 2013/0069278 A1 | 3/2013 | Kobayashi | |

FOREIGN PATENT DOCUMENTS

| | | |
|---|---|---|
| JP | 2007081070 A | 3/2007 |
| JP | 2011042068 A | 3/2011 |
| JP | 2012099197 A | 5/2012 |
| JP | 2013179219 A | 9/2013 |
| JP | 2014120604 A | 6/2014 |
| JP | 2014154600 A | 8/2014 |
| WO | 2009113357 A1 | 9/2009 |

OTHER PUBLICATIONS

Akamatsu, "Basis and Practical Use of Photosensitive Resin", CMC, pp. 242-243. Cited in specification. Partial English translation provided.

Search Report and Written Opinion issued in Singaporean Appln. No. 10201700817U dated Oct. 3, 2019.

Jedrzejewska "Factors affecting the TMPTA radical polymerization photoinitiated by phenyltrialkylborates paired with tri-cationic hemicyanine dye. Kinetic studies" Colloid Polym. Sci. May 2013. vol. 291, No. 9, pp. 2225-2236. Cited in NPL 1.

Office Action issued in Japanese Appln. No. 2018-229192 dated Oct. 7, 2019.

Office Action issued in Chinese Appln. No. 201710070872.9 dated Mar. 6, 2020. English translation provided.

* cited by examiner

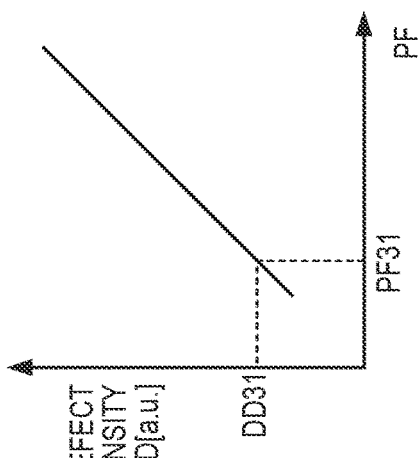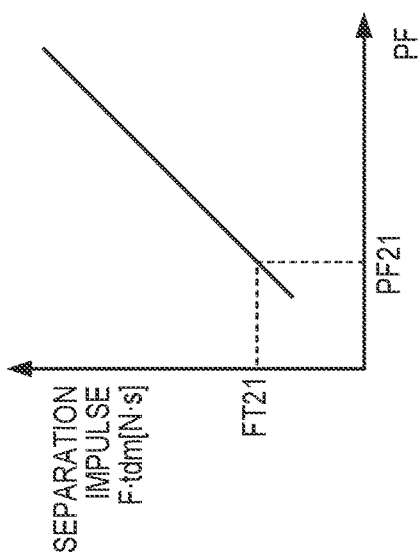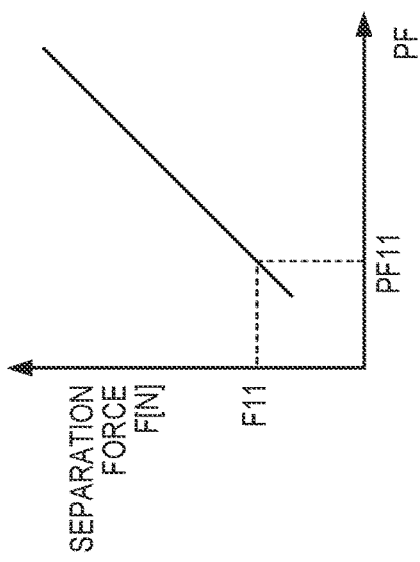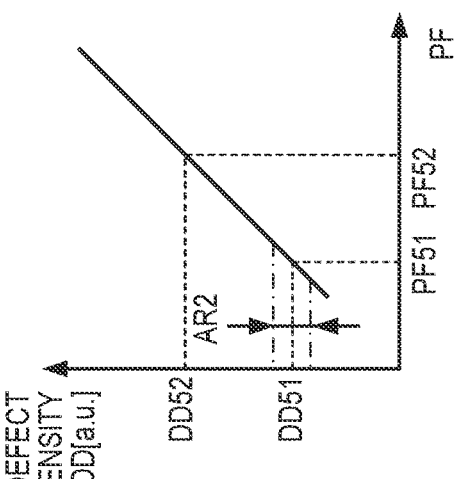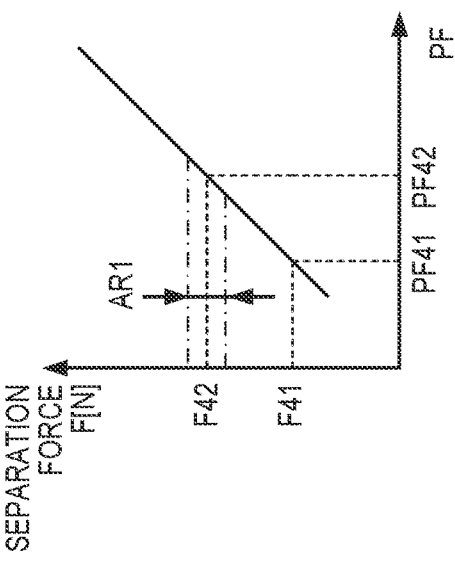

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint technique by which an imprint material is placed on a substrate and cured by being irradiated with light while a mold is brought in contact with the imprint material, thereby transferring a pattern of the mold onto the imprint material, is attracting attention. The degree of cure of the imprint material depends on the amount of light with which the imprint material is irradiated. Japanese Patent Laid-Open No. 2012-099197 describes a double-sided imprint apparatus in which the irradiation time of a UV light source arranged in a lower-side stamper is made shorter than that of a UV light source arranged in an upper-side stamper. In this double-sided imprint apparatus, a transferred material can be released from the upper-side stamper after the transferred material is released from the lower-side stamper because the force required for release depends on the irradiation time. "Basis and Practical Use of Photosensitive Resin", CMC, supervised by Kiyoshi Akamatsu, pp. 242-243 describes that chemical reaction velocity of a radical polymerizable resist is proportional to the square root of illuminance.

In the conventional imprint apparatus, the time during which an imprint material is irradiated with light is optimized in advance, and the imprint material is cured by controlling light irradiation to the imprint material in accordance with the irradiation time. Therefore, if the illuminance decreases due to, for example, deterioration of the light source, cure of the imprint material may become insufficient. In the conventional imprint apparatus, the degree of photopolymerization (the degree of cure) of a radical polymerizable imprint material is not automatically adjusted to a target value.

SUMMARY OF THE INVENTION

The present invention provides a technique advantageous in preferably controlling the degree of photopolymerization of a radical polymerizable imprint material in an imprint apparatus which uses the imprint material.

One of features of the present invention provides an imprint apparatus for forming a pattern by curing a radical polymerizable imprint material by irradiating the imprint material with light in a state in which a mold is brought into contact with the imprint material, comprising: an irradiator configured to irradiate the imprint material with light; and a controller configured to control the irradiator, wherein letting $I_c$ be an illuminance of the light with which the imprint material is irradiated, $t_c$ be a time during which the imprint material is irradiated with the light, k be a coefficient, and PD be a target degree of photopolymerization of the imprint material subjected to irradiation with the light, the controller determines the irradiation time in accordance with: $PD = k \times (\sqrt{I_c}) \times t_c$.

Further features of the present invention will become apparent from the following description of exemplary embodiments with reference to the attached drawings.

BRIEF DESCRIPTION OF THE DRAWINGS

FIG. 5A is a view showing a correlation between a separation force and a polymerization factor;

FIG. 5B is a view showing a correlation between a separation impulse and the polymerization factor;

FIG. 5C is a view showing a correlation between a defect density and the polymerization factor; and FIGS. 6A and 6B are views showing the principle of determining the success/failure of imprinting based on the correlation (FIG. 6A) between the separation force and the polymerization factor, and the correlation (FIG. 6B) between the defect density and the polymerization factor.

DESCRIPTION OF THE EMBODIMENTS

Exemplary embodiments of the present invention will be explained below with reference to the accompanying drawings.

Figure 1:
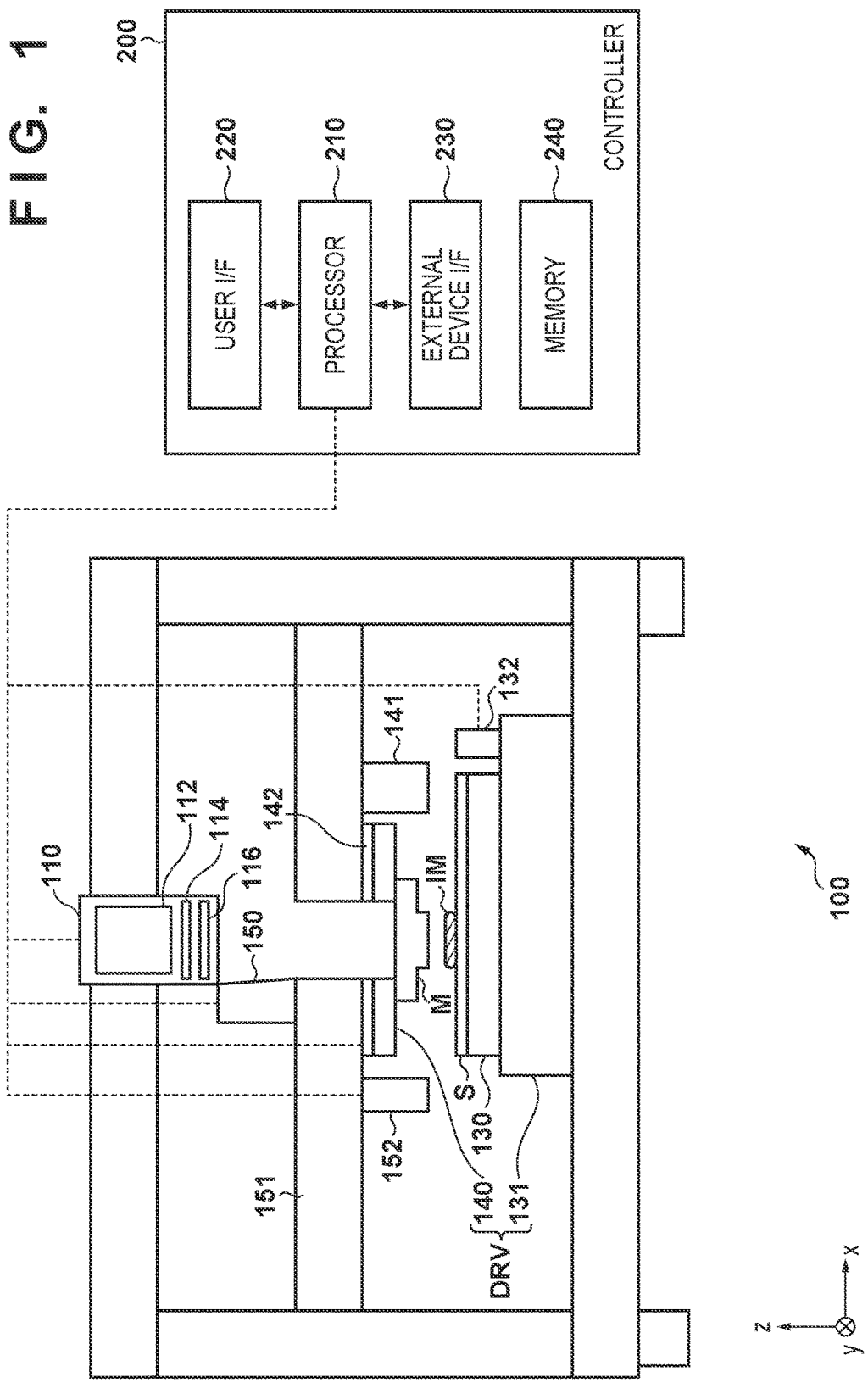
FIG. 1 is a view showing the arrangement of an imprint apparatus of an embodiment of the present invention.
Figure 2:
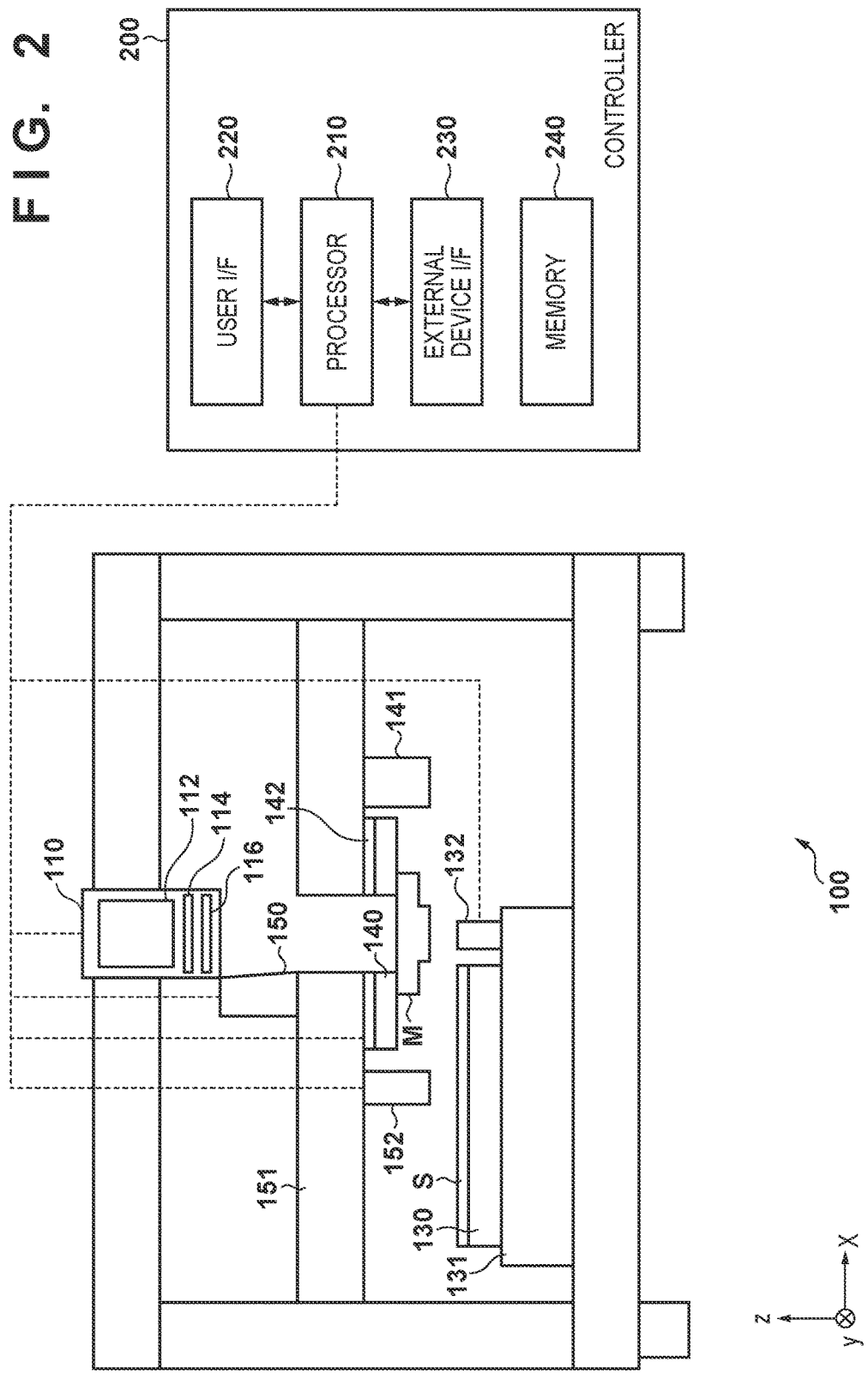
FIG. 2 is a view showing the arrangement of the imprint apparatus of the embodiment of the present invention.

FIGS. 1 and 2 are views showing the arrangement of an imprint apparatus 100 of an embodiment of the present invention. FIGS. 1 and 2 depict the arrangement of the same imprint apparatus 100, but illustrate different states. In the imprint apparatus 100, a mold M is brought into contact with an imprint material IM placed on a substrate S, and the imprint material IM is cured by being irradiated with light in this state, thereby forming a pattern made of the imprint material IM. The imprint material IM can be a photo-radical polymerizable compound containing a photopolymerization initiator (photo-radical initiator) and a radical polymerizable compound. An imprint material comprised of a photo-radical polymerizable compound may be called as a radical polymerizable imprint material. The photo-radical polymerizable compound is a compound which reacts with a polymerizing factor (for example, a radical) generated by irradiating the photopolymerization initiator with light, and forms a polymerized compound film by a chain reaction (polymerization reaction). The photochemical reaction velocity of the imprint material IM may be proportional to the square root of the illuminance of light with which the imprint material IM is irradiated.

In the accompanying drawings and this specification, directions are indicated by the XYZ coordinate system in which the substrate S is placed on the XY plane. The imprint apparatus 100 includes an irradiator 110 which irradiates the imprint material IM on the substrate S with light, and a controller 200. The irradiator 110 causes a photochemical reaction (photopolymerization) in the imprint material IM by irradiating the imprint material IM with light, thereby curing the imprint material IM. The irradiator 110 can include a light source 112, a shutter 114 for passing or blocking off light from the light source 112 in order to control the time during which the imprint material IM is irradiated with light, and an adjustor 116 which adjusts the illuminance of light with which the imprint material IM is irradiated. The shutter 114 controls the time during which the irradiator 110 irradiates the imprint material IM with light, in accordance with the irradiation time designated by the controller 200. The adjustor 116 can include a plurality of ND (Neutral Density) filters. The adjustor 116 controls the illuminance of light which irradiates the imprint material IM, in accordance with the illuminance designated by the controller 200. The illuminance can be adjusted by adjusting the number of ND filters arranged between the light source 112 and the substrate S, or by changing a combination of a plurality of ND filters having different extinction effects.

The imprint apparatus 100 can further include a supply 141 which places or supplies the imprint material IM on the substrate S. The supply 141 can include a tank containing the imprint material IM, and a discharge head for discharging the imprint material supplied from the tank from a discharge hole.

In addition, the imprint apparatus 100 can include a substrate holder 130 for holding the substrate S, a substrate driving mechanism 131 for driving the substrate S by driving the substrate holder 130, and a mold driving mechanism 140 for holding and driving the mold M. For example, the substrate driving mechanism 131 can be so configured as to drive the substrate holder 130 with respect to the X-axis, the Y-axis, and the θZ-axis (rotation around the Z-axis), thereby driving the substrate S with respect to the X-axis, Y-axis, and θZ-axis. The mold driving mechanism 140 can be so configured as to hold the mold M, and drive the mold M with respect to, for example, six axes, that is, the X-axis, the Y-axis, the Z-axis, the θX-axis (rotation around the X-axis), the θY-axis, (rotation around the Y-axis), and the θZ-axis. The operation of driving the mold M with respect to the Z-axis by the mold driving mechanism 140 includes an operation of bringing the mold M into contact with the imprint material IM on the substrate S, and an operation of separating the mold M from the imprint material IM. The substrate driving mechanism 131 can also perform the operations of bringing the mold M into contact with the imprint material IM on the substrate S and separating the mold M from the imprint material IM. The substrate driving mechanism 131 and mold driving mechanism 140 form a driving mechanism DRV for controlling the relative distance between the imprint material IM (or the substrate S) and the mold M. In a state in which the driving mechanism DRV controls the relative distance such that the mold M is brought into contact with the imprint material IM supplied on the substrate S, the irradiator 110 irradiates the imprint material IM with light so as to cure the imprint material IM, thereby curing the imprint material IM. After that, the driving mechanism DRV controls the relative distance so as to separate the mold M from the cured imprint material IM.

The mold driving mechanism 140 can include a separation force detector 142 for detecting the separation force required to separate the mold M from the cured imprint material IM on the substrate S. This separation force detected by the separation force detector 142 can be provided for the controller 200. Based on time-series data of the separation force detected by the separation force detector 142, the controller 200 can obtain the product (impulse) of the separation force and the time during which the separation force acts on the mold M. The separation force detector 142 can also obtain the time during which the separation force acts on the mold M or the impulse, and provide the time or impulse for the controller 200.

The imprint apparatus 100 can further include an illuminance detector 132 for detecting the illuminance of light with which the irradiator 110 irradiates the imprint material IM. The illuminance detector 132 can be incorporated into, for example, the substrate holder 130 or substrate driving mechanism 131. As shown in FIG. 2, when the illuminance detector 132 is arranged in a region which the irradiator 110 irradiates with light, it is possible to detect the illuminance of light with which the irradiator 110 irradiates the imprint material IM. The illuminance detector 132 can be built in the irradiator 110 or mold driving mechanism 140, and can also be arranged in another position. The illuminance detector 132 can include a photosensor or the like, and can obtain the illuminance based on information output from the photosensor. The controller 200 can also calculate the illuminance based on information provided from the illuminance detector 132.

The imprint apparatus 100 can further include an alignment scope (measuring instrument) 150. The alignment scope 150 detects a mark formed on the substrate S and a mark formed on the mold M. The mold M and substrate S can be aligned based on the detection result obtained by the alignment scope 150. For example, the alignment scope 150 can be an automatic adjustment scope (AAS). In addition, the imprint apparatus 100 can include an off-axis scope 152 (OAS) which detects a mark formed on the substrate S without the mold M. The off-axis scope 152 can be so configured as to detect a reference mark formed in the substrate holder 130 or in a predetermined portion (a portion having a fixed positional relationship with the substrate holder 130) of the substrate driving mechanism 131. The alignment scope 150 and off-axis scope 152 can be supported by a frame 151.

The controller 200 can include a processor 210, a user interface 220, an external device interface 230, and a memory 240. The processor 210 can be a computer in which a program is installed. The user interface 220 is an interface between the processor 210 and the user, and can include an input device (for example, a keyboard, touch panel, or pointing device) and an output device (for example, a display). The external device interface 230 is, for example, an interface which connects to another device (for example, a defect testing device) via a communication medium such as a network. The memory 240 stores data provided for the controller 200 via the user interface 220 or external device interface 230.

Figure 3:
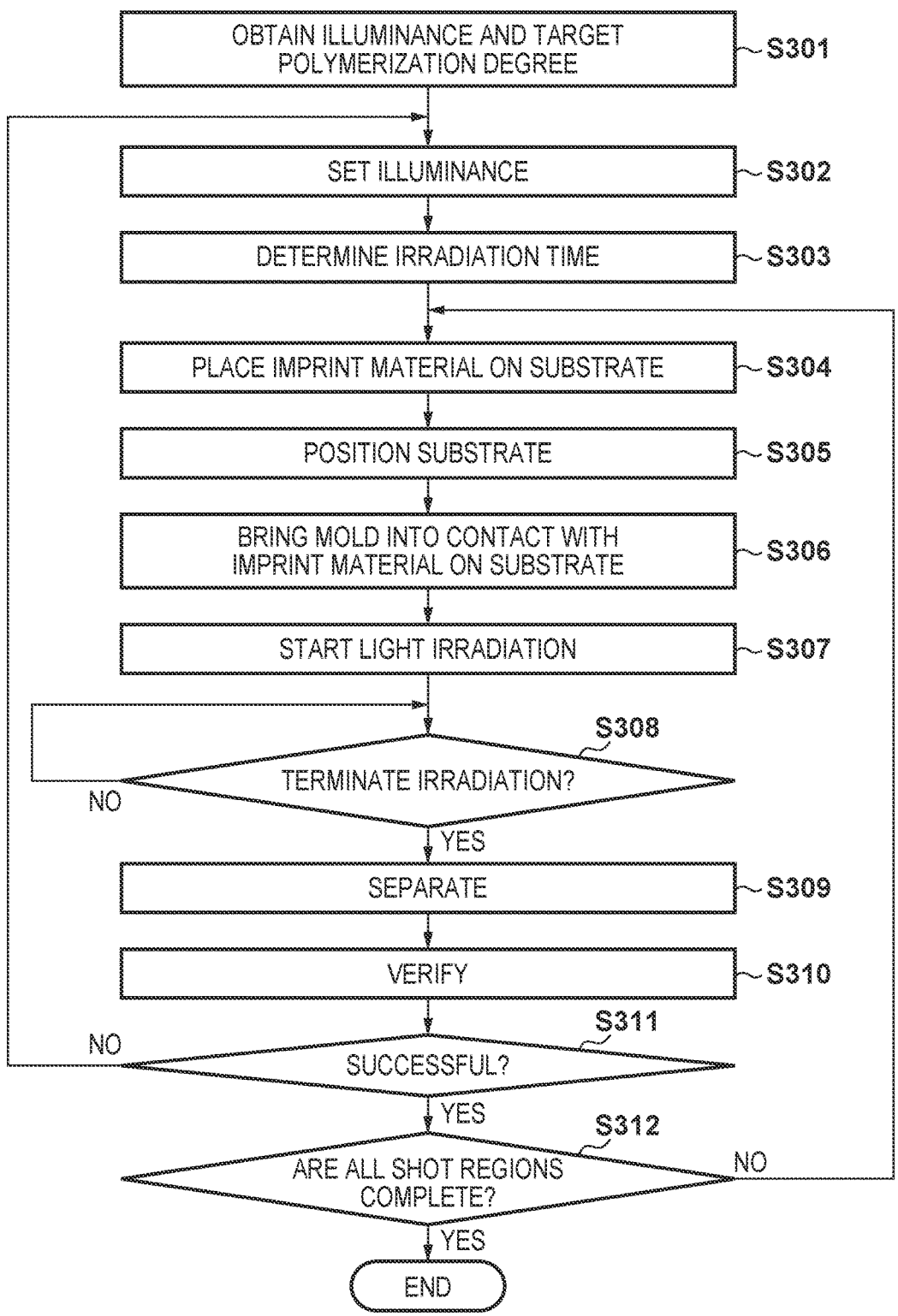
FIG. 3 is a view showing the operation of an imprint apparatus of the first embodiment of the present invention.

FIG. 3 shows the operation of the imprint apparatus 100 of the first embodiment. This operation is controlled by the controller 200, and more specifically, by the processor 210. In step S301, the processor 210 obtains an illuminance $I_c$ (W/m$^2$) and a target polymerization degree PD (($\sqrt{(W/m^2)}$) ·sec) via, for example, the user interface 220 or external device interface 230. The user can also input the target polymerization degree PD (($\sqrt{(W/m^2)}$)·sec) via the user interface 220 or external device interface 230. The illuminance $I_c$ need not be provided as information directly indicating the illuminance $I_c$. For example, it is also possible to provide information necessary to obtain the illuminance $I_c$ by calculations or the like, and acquire the illuminance $I_c$ based on the provided information. Likewise, the target polymerization degree PD need not be provided as information directly indicating the target polymerization degree PD. For example, it is also possible to provide information necessary to obtain the target polymerization degree PD by calculations or the like, and acquire the target polymerization degree PD based on the provided information. The illuminance $I_c$ and target polymerization degree PD can be provided by a recipe file (control information group) for controlling an imprinting process. In step S302, the processor 210 sets the illuminance $I_c$ in the adjuster 116 of the irradiator 110. In accordance with this setting, the adjuster 116 adjusts the illuminance such that light with which the imprint material IM is irradiated has the illuminance $I_c$. The processor 210 may also cause the illuminance detector 132 to detect the illuminance, and confirm that the detected illuminance matches the illuminance $I_c$. Alternatively, the illuminance detected by the illuminance detector 132 may also be used as the illuminance $I_c$ to be taken into account when determining an irradiation time $t_c$ to be explained below.

In step S303, based on the illuminance $I_c$ and target polymerization degree PD, the processor 210 determines the irradiation time $t_c$ (sec) of light with respect to the imprint material IM in accordance with equation (1). In this equation, the target polymerization degree PD is an index indicating the target degree of cure of the imprint material IM. k is a coefficient and determined in advance through experiments or the like. $t_c$ is the irradiation time (sec) of light with respect to the imprint material IM.

$$PD = k \times (\sqrt{Ic}) \times tc \quad (1)$$

More specifically, in step S303, the processor 210 determines the irradiation time $t_c$ in accordance with:

$$t_c = PD/(k \times (\sqrt{I_c})) \quad (2)$$

Equation (1) will be explained below. Equation (1) is obtained as follows from equation (3) indicating a polymerization factor PF as a photochemical reaction velocity:

$$PF = (\sqrt{I}) \times t \quad (3)$$

where PF is the polymerization factor $((\sqrt{(W/m^2)}) \cdot sec)$, I is the illuminance ($W/m^2$) of light with respect to the imprint material IM, and t is the irradiation time (sec) of light with respect to the imprint material IM. Equation (3) shows that the polymerization factor PF as a photochemical reaction velocity is proportional to the square root of the illuminance I of light, and is also proportional to the irradiation time t. The target polymerization degree PD can be defined by an irradiation time $t_p$ at a given illuminance $I_p$. The target polymerization degree PD, illuminance $I_p$, irradiation time $t_p$, illuminance $I_c$, and irradiation time $I_c$ have a relationship indicated by:

$$PD = (\sqrt{I_p}) \times t_p = k \times (\sqrt{I_c}) \times t_c \quad (4)$$

The illuminance $I_p$ is the illuminance ($W/m^2$) as a condition when the target polymerization degree PD is determined, and the irradiation time $t_p$ is the irradiation time (sec) as a condition when the target polymerization degree PD is determined. A coefficient k is determined by, for example, the type of the imprint material IM, the mold M, and the process. The coefficient k is 1 in some cases and is not 1 in other cases. The irradiation time $I_c$ is the illuminance ($W/m^2$) of light which irradiates the imprint material IM during imprinting. $t_c$ is the irradiation time (sec) required during imprinting in order to satisfy the target polymerization degree PD under the illuminance $I_c$. Equation (1) is a simplified version of equation (4).

In step S304, the processor 210 controls the supply 141 and substrate driving mechanism 131 so that the supply 141 supplies the imprint material IM to an imprint target shot region of the substrate S. In step S305, the processor 210 controls the substrate driving mechanism 131 so as to position the imprint target shot region of the substrate S below the mold M. In step S306, the processor 210 controls the mold driving mechanism 140 so as to bring the mold M into contact with the imprint material IM on the imprint target shot region. In step S307, the processor 210 waits until the imprint material IM is sufficiently filled in a recess of the pattern region of the mold M, and controls the irradiator 110 so as to irradiate the imprint material IM with light through the mold M, thereby starting light irradiation to the imprint material IM. More specifically, the processor 210 starts light irradiation to the imprint material IM by controlling the shutter 114 so as to pass the light. In step S308, the processor 210 controls the irradiator 110 so as to terminate light irradiation to the imprint material IM in accordance with the elapse of the irradiation time $t_c$ determined in step S303. More specifically, the processor 210 terminates light irradiation to the imprint material IM by controlling the shutter 114 so as to block off the light. Consequently, the imprint material IM is so cured as to reach the target polymerization degree PD. In step S309, the processor 210 controls the mold driving mechanism 140 so as to separate the mold M from the cured imprint material IM. Note that the operation of separating the mold M from the cured imprint material IM is called separation.

Steps S310 and S311 are arbitrary steps. A separation force F (N) required to separate the mold M from the cured imprint material IM has a correlation with the polymerization factor PF. Also, the product of the separation force F (N) and a time $t_{dm}$ (sec) during which the separation force F acts on the mold M, that is, an impulse (to be referred to as a separation impulse hereinafter) has a correlation with the polymerization factor PF. Furthermore, a defect density DD in the pattern of the imprint material IM remaining after separation has a correlation with the polymerization factor PF. Therefore, it is possible by using these correlations to determine whether the imprint material IM is so cured as to reach the target polymerization degree PD (that is, whether cure is successful). FIG. 5A shows the correlation between the separation force F and the polymerization factor PF, FIG. 5B shows the correlation between the separation impulse F×t and the polymerization factor PF, and FIG. 5C shows the correlation between the defect density DD and the polymerization factor PF. Each of these correlations indicates a linear relationship (proportional relationship), but this relationship is an example, and the correlation is not necessarily linear.

Assuming that target polymerization degree PD=PF11, if the separation force detected during separation by the separation force detector 142 falls within an allowable range containing F11, it is possible to determine that the imprint material IM is so cured as to fall within an appropriate range of the target polymerization degree PD. Assuming that target polymerization degree PD=PF21, if the separation impulse detected during separation by the separation force detector 142 falls within an allowable range containing FT21, it is possible to determine that the imprint material IM is so cured as to fall within the appropriate range of the target polymerization degree PD. Assuming that target polymerization degree PD=PF31, if the defect density DD measured by using a testing apparatus (not shown) falls within an allowable range containing DD31, it is possible to determine that the imprint material IM is so cured as to fall within the appropriate range of the target polymerization degree PD.

In step S311, the processor 210 determines whether the imprint material IM is so cured as to fall within the appropriate range of the target polymerization degree PD, in the verification of items such as the abovementioned separation force F, separation impulse F×t, and defect density DD. If it is determined that the imprint material IM is so cured as to fall within the appropriate range of the target polymerization degree PD, the process advances to step S312. If not, the process returns to step S302. If the process returns to step S302, that is, if the imprint material IM is cured so as not to fall within the appropriate range of the target polymerization degree PD, the illuminance may not correctly be set or adjusted. In step S302, the illuminance is so reset or readjusted as to match the illuminance $I_c$. In step S303, the irradiation time $t_c$ is redetermined in accordance with the reset or readjusted illuminance $I_c$. The processing in step S302 can include detection of the illuminance $I_c$ by the illuminance detector 132.

In step S312, the processor 210 determines whether imprinting of all imprint target shot regions of the substrate S is complete. If an imprint target shot region remains, the process returns to step S304, and imprinting is performed on the remaining shot region. In this imprinting, the target polymerization degree PD can also be set for each shot region. In this case, the process returns from step S312 to step S301.

If the defect density test requires an unallowably long time in step S310, step S310 may also be performed when, for example, processing of one substrate S is complete, processing of the first substrate of the lot is complete, or processing of the last substrate of the lot is complete.

Figure 4:
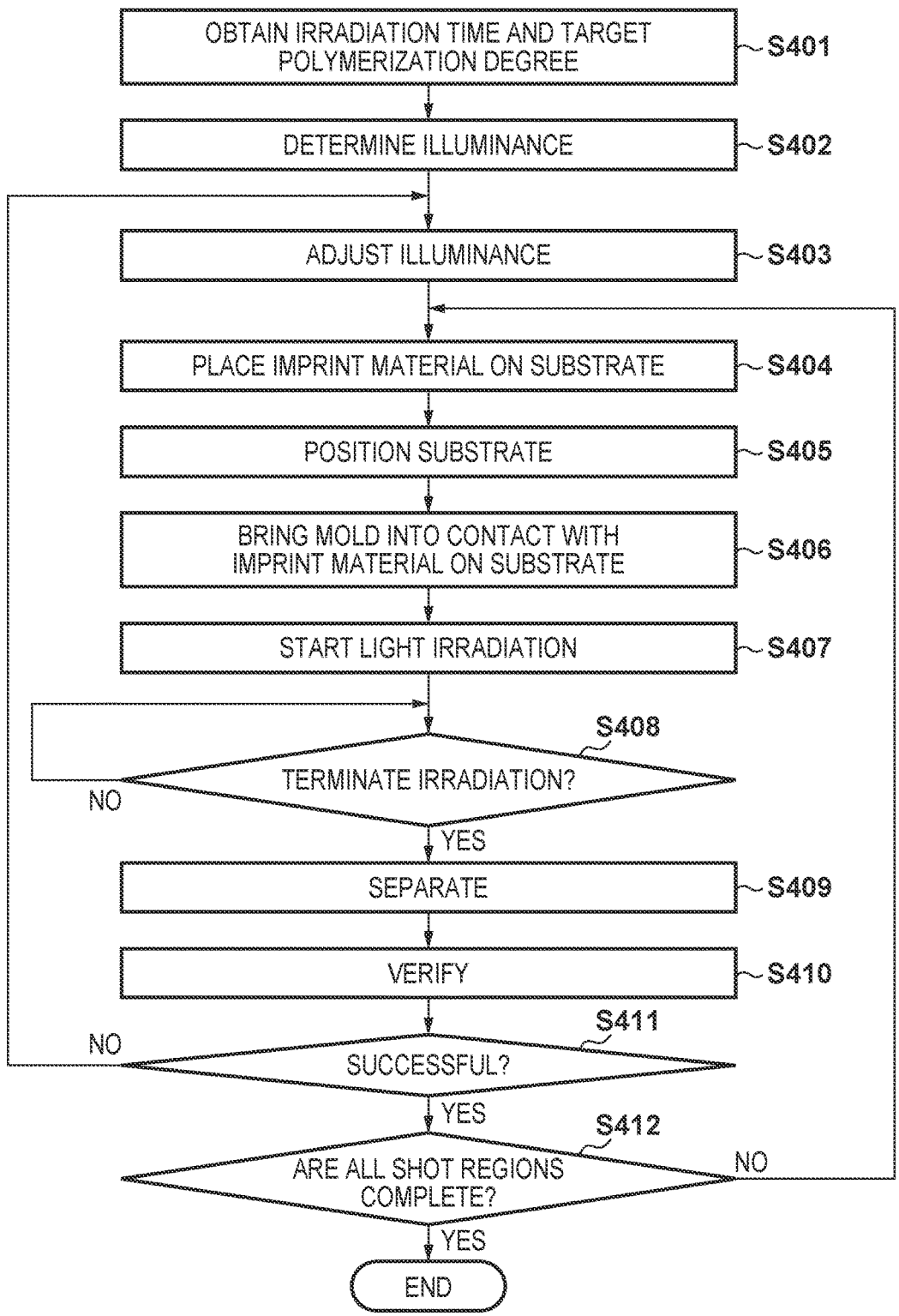
FIG. 4 is a view showing the operation of an imprint apparatus of the second embodiment of the present invention.

FIG. 4 shows the operation of the imprint apparatus 100 of the second embodiment. This operation is controlled by the controller 200, and more specifically, by the processor 210. In step S401, the processor 210 obtains the irradiation time $t_c$ (sec) and the target polymerization degree PD via the user interface 220 or external device interface 230. The user can also input the target polymerization degree PD $((\sqrt{(W/m^2)}) \cdot sec)$ via the user interface 220 or external device interface 230. The irradiation time $t_c$ need not be provided as information directly indicating the irradiation time $t_c$. For example, it is also possible to provide information necessary to obtain the irradiation time $t_c$ by calculations or the like, and acquire the irradiation time $t_c$ based on the provided information. Likewise, the target polymerization degree PD need not be provided as information directly indicating the target polymerization degree PD. For example, it is also possible to provide information necessary to obtain the target polymerization degree PD by calculations or the like, and acquire the target polymerization degree PD based on the provided information. The irradiation time $t_c$ and target polymerization degree PD can be provided by a recipe file (control information group) for controlling an imprinting process. In step S402, based on the irradiation time $t_c$ and target polymerization degree PD acquired in step S401, the processor 210 determines the illuminance $I_c$ in the adjuster 116 of the irradiator 110 in accordance with equation (1), and more specifically, equation (5).

$$I_c = (PD/t_c)^2 \quad (5)$$

In step S403, the processor 210 adjusts the illuminance of light with which the irradiator 110 irradiates the imprint material IM, so as to obtain the illuminance $I_c$ determined in step S402. The processor 210 can perform this adjustment by controlling the adjustor 116 of the irradiator 110. For example, if the adjuster 116 includes a plurality of ND filters, the illuminance can be adjusted by adjusting the number of ND filters arranged between the light source 112 and the substrate S, or by changing a combination of a plurality of ND filters having different extinction effects. In this step, the processor 210 may also cause the illuminance detector 132 to detect the illuminance, and confirm that the detected illuminance matches the illuminance $I_c$.

In step S404, the processor 210 controls the supply 141 and substrate driving mechanism 131 so that the supply 141 supplies the imprint material IM to an imprint target shot region of the substrate S. In step S405, the processor 210 controls the substrate driving mechanism 131 so as to position the imprint target shot region of the substrate S below the mold M. In step S406, the processor 210 controls the mold driving mechanism 140 so as to bring the mold M into contact with the imprint material IM on the imprint target shot region. In step S407, the processor 210 waits until the imprint material IM is sufficiently filled in a recess of the pattern region of the mold M, and controls the irradiator 110 so as to irradiate the imprint material IM with light through the mold M, thereby starting light irradiation to the imprint material IM. More specifically, the processor 210 starts light irradiation to the imprint material IM by controlling the shutter 114 so as to pass the light. In step S408, the processor 210 controls the irradiator 110 so as to terminate light irradiation to the imprint material IM in accordance with the elapse of the irradiation time $t_c$ determined in step S401. More specifically, the processor 210 terminates light irradiation to the imprint material IM by controlling the shutter 114 so as to block off the light. Consequently, the imprint material IM is so cured as to reach the target polymerization degree PD. In step S409, the processor 210 controls the mold driving mechanism 140 so as to separate the mold M from the cured imprint material IM.

Steps S410 and S411 are arbitrary steps. In step S410, the same verification as that in step S310 of FIG. 3 can be performed. In step S411, the processor 210 determines whether the imprint material IM is so cured as to fall within the appropriate range of the target polymerization degree PD, in the verification of items such as the abovementioned separation force F, separation impulse F×t, and defect density DD. If it is determined that the imprint material IM is so cured as to fall within the appropriate range of the target polymerization degree PD, the process advances to step S412. If not, the process returns to step S403. If the process returns to step S403, that is, if the imprint material IM is cured so as not to fall within the appropriate range of the target polymerization degree PD, the illuminance may not correctly be adjusted. In step S403, the illuminance is so readjusted as to match the illuminance $I_c$.

In step S412, the processor 210 determines whether imprinting of all imprint target shot regions of the substrate S is complete. If an imprint target shot region remains, the process returns to step S404, and imprinting is performed on the remaining shot region. In this imprinting, the target polymerization degree PD can also be set for each shot region. In this case, the process returns from step S412 to step S401. If the defect density test requires an unallowably long time in step S410, step S410 may also be performed when, for example, processing of one substrate S is complete, processing of the first substrate of the lot is complete, or processing of the last substrate of the lot is complete.

In the first and second embodiments as described above, in an imprint apparatus using an imprint material having a photochemical reaction velocity proportional to the square root of the illumination of emitted light, control can be performed such that the degree of photopolymerization of the imprint material falls within an allowable range of the target photopolymerization degree PD.

A method of manufacturing a device (for example, a semiconductor integrated circuit element or liquid crystal display element) as an article includes a step of forming a pattern on a substrate (a wafer, glass plate, or film-like substrate) by using the above-described imprint apparatus. In addition, this manufacturing method can include a step of processing (for example, etching) the substrate on which the pattern is formed. Note that when manufacturing another article such as a patterned medium (recording medium) or optical element, the manufacturing method can include another process of processing the substrate on which the pattern is formed, instead of etching. When compared to the conventional methods, the article manufacturing method of this embodiment is advantageous in at least one of the performance, quality, productivity, and production cost of an article.

Example 1

In Example 1, an irradiation time $t_c$ corresponding to an illuminance $I_c$ and target polymerization degree PD as conditions was determined, and an imprint material was cured at the illuminance $I_c$ for the irradiation time $t_c$, thereby confirming that a good imprint result was obtained. More specifically, an imprint material having a coefficient k of 1 was used, and illuminance $I_c$=5000 (W/m$^2$) and target polymerization degree PD=7.07 ((√(W/m$^2$))·sec) were input as conditions from the user interface 220. Then, irradiation time $t_c$=0.1 (sec) was determined in accordance with equation (1). Based on this, the imprint material was irradiated with light at illuminance $I_c$=5000 (W/m$^2$) for irradiation time $t_c$=0.1 (sec). Consequently, a good imprint result (that is, a good pattern made of the cured imprint material) was obtained.

Example 2

In Example 2, an imprint material having k=1 was used, an illuminance $I_p$ (W/m$^2$) and a recommended exposure amount $E_p$ (J/m$^2$) at the illuminance $I_p$ (W/m$^2$) were acquired as conditions for obtaining a target polymerization degree PD, and an irradiation time $t_p$ (sec) was obtained in accordance with:

$$t_p = E_p/I_p \qquad (6)$$

Also, the illuminance of imprinting was $I_c$ (W/m$^2$). Based on $I_p$, $t_p$, and $I_c$, an irradiation time $t_c$ was determined in accordance with equation (4). When the imprint material was irradiated with light at $I_c$ for $t_c$, a good imprint result (that is, a good pattern made of the cured imprint material) was obtained.

Example 3

In Example 3, an imprint material having k=1 was used, an illuminance $I_p$ (W/m$^2$) and a recommended exposure amount $E_p$ (J/m$^2$) at the illuminance $I_p$ (W/m$^2$) were acquired as conditions for obtaining a target polymerization degree PD, and an irradiation time $t_p$ (sec) was obtained in accordance with:

$$t_p = E_p/I_p \qquad (6)$$

Also, the irradiation time of imprinting was set at $t_c$ (sec). Based on $I_p$, $t_p$, and $t_c$, an illuminance $I_c$ was determined in accordance with equation (4), and the adjuster 116 of the irradiator 110 was adjusted so as to obtain the illuminance $I_c$. When the imprint material was irradiated with light at $I_c$ for $t_c$, a good imprint result (that is, a good pattern made of the cured imprint material) was obtained.

Example 4

In Example 4, the validity of steps S310 and S410 (verification) was confirmed. Data indicating a correlation between a separation force F and a polymerization factor PF as shown in FIG. 6A was prepared. An imprint material was cured by being irradiated with light under conditions in which an illuminance $I_c$ was intentionally changed from the illuminance $I_c$ and an irradiation time $t_p$ which were so determined as to obtain target polymerization degree PD=PF42. When the separation force F for separating the mold M from this imprint material was detected by the separation force detector 142, F=F41. An allowable range of the separation force F when PD=PF42 is AR1 containing F=F42. Since F=F41 fell outside the allowable range AR1, it was determined that cure of the imprint material was inappropriate. When imprinting was performed by readjusting the illuminance $I_p$ to a correct value, the separation force F fell within the allowable range AR1 containing F=F42.

Example 5

In Example 5, the validity of steps S310 and S410 (verification) was confirmed. Data indicating a correlation between a defect density DD and a polymerization factor PF as shown in FIG. 6B was prepared. An imprint material was cured by being irradiated with light under conditions in which an illuminance $I_c$ was intentionally changed from the illuminance $I_c$ and an irradiation time $t_p$ which were so determined as to obtain target polymerization degree PD=PF51, thereby obtaining a pattern. When the defect density DD of this pattern was tested by using a testing apparatus, DD=DD52. An allowable range of the defect density DD when PD=PF51 is AR2 containing DD=DD51. Since DD=DD52 fell outside the allowable range AR2, it was determined that cure of the imprint material was inappropriate. When imprinting was performed by readjusting the illuminance $I_c$ to a correct value, the defect density DD fell within the allowable range AR2 containing DD=D51.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-025202, filed Feb. 12, 2016, which is hereby incorporated by reference herein in its entirety.

What is claimed is:

1. An apparatus for curing a material by irradiating the material with light in a state in which a mold is in contact with the material, photochemical reaction velocity of the material being proportional to a square root of an illuminance of the light with which the material is irradiated, the apparatus comprising:
an irradiator configured to irradiate the material with light for curing the material;
a controller configured to control the irradiator; and
an interface configured to acquire a target value regarding a polymerization degree of the material,
wherein the controller determines that whether or not the material is cured such that a degree of polymerization of the material falls within a predetermined range of the target value, and
wherein the controller determines the irradiation time during which the material is irradiated with the light from the irradiator based on the square root of the illuminance of the light from the irradiator, with which the material is irradiated, and the target value in a case that the controller determines that the material is not cured such that the degree of the polymerization of the material falls within the predetermined range.

2. The apparatus according to claim 1, wherein the controller determines the irradiation time during which the material is irradiated with the light from the irradiator by dividing the target value by the square root of the illuminance.

3. The apparatus according to claim 1, wherein letting Ic be the illuminance of the light from the irradiator, with which the material is irradiated, tc be the irradiation time during which the material is irradiated with the light, k be a coefficient, and PD be the target value regarding the polymerization degree of the material subjected to irradiation with the light, the controller determines the irradiation time in accordance with:

$PD = k \times (\sqrt{I_c}) \times tc$.

4. The apparatus according to claim 3, further comprising an illuminance detector configured to detect the illuminance of the light with which the irradiator irradiates the material,
wherein letting Ic be the illuminance detected by the illuminance detector, the controller determines the irradiation time in accordance with:

$PD = k \times (\sqrt{I_c}) \times tc$.

5. The apparatus according to claim 1, further comprising:
a supply configured to supply the material on a substrate;
a driving mechanism configured to change a relative distance between the material and the mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to cause the illumination detector to detect the illuminance of the light and to determine the irradiation time based on square root of the illuminance detected by the illuminance detector in case that the separation force while the relative distance is changed by the driving mechanism so as to separate the mold from the piece of the material falls outside an allowable range.

6. The apparatus according to claim 1, further comprising:
a supply configured to supply the material on the substrate;
a driving mechanism configured to change a relative distance between the material and a mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to cause the illumination detector to detect illuminance of the light and to determine the irradiation time based on square root of the illuminance detected by the illuminance detector in case that a product of (a) the separation force while the relative distance is changed by the driving mechanism so as to separate the mold from the piece of the material and (b) a time during which the separation force acts on the mold falls outside an allowable range.

7. The apparatus according to claim 1, further comprising:
an illuminance detector configured to detect the illuminance of the light with which the irradiator irradiates the material,
wherein the controller is configured to cause the illuminance detector to detect the illuminance and to determine the irradiation time based on square root of the illuminance of detected by the illuminance detector in case that a defect density in a pattern obtained by curing the material falls outside an allowable range.

8. An article manufacturing method comprising:
forming a pattern on a substrate by using the apparatus as defined in claim 1 and processing the substrate on which the pattern is formed,
wherein the article is obtained from the processed substrate.

9. An apparatus for curing a radical polymerizable material by irradiating the material with light in a state in which a mold is in contact with the material, comprising:
an irradiator configured to irradiate the material with light for curing the material; and
a controller configured to control the irradiator; and
an interface configured to acquire a target value regarding a polymerization degree of the material,
wherein the controller determines that whether or not the material is cured such that a degree of polymerization of the material falls within a predetermined range of the target value, and
wherein the controller determines the irradiation time during which the material is irradiated with the light from the irradiator based on a square root of the illuminance of the light from the irradiator, with which the material is irradiated, and the target value in a case that the controller determines that the material is not cured such that the degree of the polymerization of the material falls within the predetermined range.

10. The apparatus according to claim 9, wherein the controller determines the irradiation time during which the material is irradiated with the light from the irradiator by dividing the target value by the square root of the illuminance.

11. The apparatus according to claim 9, wherein letting Ic be the illuminance of the light from the irradiator, with which the material is irradiated, tc be the irradiation time during which the material is irradiated with the light, k be a coefficient, and PD be the target value regarding the polymerization degree of the material subjected to irradiation with the light, the controller determines the irradiation time in accordance with:

$$PD = k \times (\sqrt{I_c}) \times tc.$$

12. The apparatus according to claim 11, further comprising an illuminance detector configured to detect the illuminance of the light with which the irradiator irradiates the material,
wherein letting Ic be the illuminance detected by the illuminance detector, the controller determines the irradiation time in accordance with:

$$PD = k \times (\sqrt{I_c}) \times tc.$$

13. The apparatus according to claim 9, further comprising:
a supply configured to supply the material on a substrate;
a driving mechanism configured to change a relative distance between the material and the mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to cause the illumination detector to detect the illuminance of the light and to determine the irradiation time based on square root of the illuminance detected by the illuminance detector in case that the separation force while the relative distance is changed by the driving mechanism so as to separate the mold from the piece of the material falls outside an allowable range.

14. The apparatus according to claim 9, further comprising:
a supply configured to supply the material on the substrate;
a driving mechanism configured to change a relative distance between the material and a mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to cause the illumination detector to detect illuminance of the light and to determine the irradiation time based on square root of the illuminance detected by the illuminance detector in case that a product of (a) the separation force while the relative distance is changed by the driving mechanism so as to separate the mold from the piece of the material and (b) a time during which the separation force acts on the mold falls outside an allowable range.

15. The apparatus according to claim 9, further comprising:
an illuminance detector configured to detect the illuminance of the light with which the irradiator irradiates the material,
wherein the controller is configured to cause the illuminance detector to detect the illuminance and to determine the irradiation time based on square root of the illuminance of detected by the illuminance detector in case that a defect density in a pattern obtained by curing the material falls outside an allowable range.

16. An article manufacturing method comprising:
forming a pattern on a substrate by using the apparatus as defined in claim 9 and processing the substrate on which the pattern is formed,
wherein the article is obtained from the processed substrate.

17. An apparatus for curing a material by irradiating the material with light in a state in which a mold is in contact with the material, photochemical reaction velocity of the material being proportional to a square root of an illuminance of the light with which the material is irradiated, the apparatus comprising:
an irradiator configured to irradiate the material with light for curing the material; and
a controller configured to control the irradiator,
wherein the controller is configured to acquire information regarding that a piece of the material has not been cured to be within a predetermined range for a target polymerization degree after irradiation to the piece of the material with light by the irradiator has finished, and
wherein the controller is configured to determine, after acquiring the information, an irradiation time during which another piece of the material is irradiated with light from the irradiator based on the square root of the illuminance of the light from the irradiator, and to control the irradiator to irradiate the other piece of the material with the light for the determined irradiation time.

18. The apparatus according to claim 17, wherein the controller determines the irradiation time during which the material is irradiated with the light from the irradiator by dividing the target polymerization degree by the square root of the illuminance.

19. The apparatus according to claim 17, wherein letting Ic be the illuminance of the light from the irradiator, with which the material is irradiated, tc be the irradiation time during which the material is irradiated with the light, k be a coefficient, and PD be the target polymerization degree, the controller determines the irradiation time in accordance with:

$$PD = k \times (\sqrt{I_c}) \times tc.$$

20. The apparatus according to claim 19, further comprising an illuminance detector configured to detect the illuminance of the light with which the irradiator irradiates the material,
wherein letting Ic be the illuminance detected by the illuminance detector, the controller determines the irradiation time in accordance with:

$$PD = k \times (\sqrt{I_c}) \times tc.$$

21. The apparatus according to claim 17, further comprising:
a driving mechanism configured to change a relative distance between the material and the mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to acquire information regarding that the separation force while the relative distance is changed by the driving mechanism so as to separate the mold from the material falls outside an allowable range, and the controller is configured to cause the illuminance detector to detect the illuminance, after acquiring the information, and to determine the irradiation time based on the illuminance detected by the illuminance detector, and
wherein the separation force falling outside the allowable range indicates that the material has not been cured to be within the predetermined range for the target polymerization degree.

22. The apparatus according to claim 17, further comprising:
a driving mechanism configured to change a relative distance between the material and the mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to acquire information regarding that a product of (a) separation force while the relative distance is changed by the driving mechanism so as to separate the mold from the material and (b) a time during which the separation force acts on the mold falls outside an allowable range, and the controller is configured to cause the illuminance detector to detect the illuminance, after acquiring the information, and to determine the irradiation time based on the illuminance detected by the illuminance detector, and
wherein the product falling outside the allowable range indicates that the material has not been cured to be within the predetermined range for the target polymerization degree.

23. The apparatus according to claim 17, further comprising:
an illuminance detector configured to detect the illuminance of the light with which the irradiator irradiates the material,
wherein the controller is configured to acquire information regarding that a defect density in a pattern obtained by curing the material falls outside an allowable range, and the controller is configured to cause the illuminance detector to detect the illuminance, after acquiring the information, and to determine the irradiation time based on the illuminance detected by the illuminance detector, and
wherein the defect density falling outside the allowable range indicates that the material has not been cured to be within the predetermined range for the target polymerization degree.

24. An apparatus for curing a radical polymerizable material by irradiating the material with light in a state in which a mold is in contact with the material, comprising:
an irradiator configured to irradiate the material with light for curing the material; and
a controller configured to control the irradiator,
wherein the controller is configured to acquire information regarding that a piece of the material has not been cured to be within a predetermined range for a target polymerization degree after irradiation to the piece of the material with light by the irradiator has finished, and
wherein the controller is configured to determine, after acquiring the information, an irradiation time during which another piece of the material is irradiated with light from the irradiator based on a square root of an illuminance of the light from the irradiator, and to control the irradiator to irradiate the other piece of the material with the light for the determined irradiation time.

25. The apparatus according to claim 24, wherein the controller determines the irradiation time during which the material is irradiated with the light from the irradiator by dividing the target polymerization degree by the square root of the illuminance.

26. The apparatus according to claim 24, wherein letting Ic be the illuminance of the light from the irradiator, with which the material is irradiated, tc be the irradiation time during which the material is irradiated with the light, k be a coefficient, and PD be the target polymerization degree, the controller determines the irradiation time in accordance with:

$$PD = k \times (\sqrt{I_c}) \times tc.$$

27. The apparatus according to claim 26, further comprising an illuminance detector configured to detect the illuminance of the light with which the irradiator irradiates the material, wherein letting Ic be the illuminance detected by the illuminance detector, the controller determines the irradiation time in accordance with:

$$PD = k \times (\sqrt{I_c}) \times tc.$$

28. The apparatus according to claim 24, further comprising:
a driving mechanism configured to change a relative distance between the material and the mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to acquire information regarding that the separation force while the relative distance is changed by the driving mechanism so as to separate the mold from the material falls outside an allowable range, and the controller is configured to cause the illuminance detector to detect the illuminance, after acquiring the information, and to determine the irradiation time based on the illuminance detected by the illuminance detector, and
wherein the separation force falling outside the allowable range indicates that the material has not been cured to be within the predetermined range for the target polymerization degree.

29. The apparatus according to claim 24, further comprising:
a driving mechanism configured to change a relative distance between the material and the mold;
a separation force detector configured to detect a separation force required to separate the mold from the material; and
an illuminance detector configured to detect the illuminance of the light with which the irradiator irradiates the material,
wherein the irradiator irradiates the material with the light such that the material is cured, in a state in which the relative distance is set by the driving mechanism so as to bring the mold into contact with the material supplied on the substrate, and then the relative distance is changed by the driving mechanism so as to separate the mold from the material, and
wherein the controller is configured to acquire information regarding that a product of (a) separation force while the relative distance is changed by the driving mechanism so as to separate the mold from the material and (b) a time during which the separation force acts on the mold falls outside an allowable range, and the controller is configured to cause the illuminance detector to detect the illuminance, after acquiring the information, and to determine the irradiation time based on the illuminance detected by the illuminance detector, and
wherein the product falling outside the allowable range indicates that the material has not been cured to be within the predetermined range for the target polymerization degree.

30. The apparatus according to claim 24, further comprising:
an illuminance detector configured to detect the illuminance of the light with which the irradiator irradiates the material,
wherein the controller is configured to acquire information regarding that a defect density in a pattern obtained by curing the material falls outside an allowable range, and the controller is configured to cause the illuminance detector to detect the illuminance, after acquiring the information, and to determine the irradiation time based on the illuminance detected by the illuminance detector, and
wherein the defect density falling outside the allowable range indicates that the material has not been cured to be within the predetermined range for the target polymerization degree.

31. An apparatus for curing a material by irradiating the material with light in a state in which a mold is in contact with the material, photochemical reaction velocity of the material being proportional to a square root of an illuminance of the light with which the material is irradiated, the apparatus comprising:
an irradiator configured to irradiate the material with light for curing the material; and
a controller configured to control the irradiator,
the irradiator including an adjustor configured to adjust an illuminance of the light with which the material is irradiated
wherein the controller is configured to acquire information regarding that a piece of the material has not been cured to be within a predetermined range for a target polymerization degree after irradiation to the piece of the material with light by the irradiator has finished, and
wherein the controller is configured to control, after acquiring the information, the adjuster to adjust an illuminance of the light from the irradiator when the irradiator irradiates another piece of the material with light based on a square of an irradiation time during which the other piece of the material is irradiated by the irradiator.

32. The apparatus according to claim 31, wherein the controller determines the illuminance by dividing the target polymerization degree by the square of the irradiation time.

33. The apparatus according to claim 31, wherein letting Ic be the illuminance of the light from the irradiator, with which the material is irradiated, tc be the irradiation time during which the material is irradiated with the light, k be a coefficient, and PD be the target polymerization degree of the material subjected to irradiation with the light, the controller determines the illuminance in accordance with:

$$PD = k \times (\sqrt{I_c}) \times tc.$$

34. An apparatus for curing a radical polymerizable material by irradiating the material with light in a state in which a mold is brought into contact with the material, the apparatus comprising:
an irradiator configured to irradiate the material with light; and
a controller configured to control the irradiator,
the irradiator including an adjustor configured to adjust an illuminance of the light with which the material is irradiated,
wherein the controller is configured to acquire information regarding that a piece of the material has not been cured to be within a predetermined range for a target polymerization degree after irradiation to the piece of the material with light by the irradiator has finished, and wherein the controller is configured to control, after acquiring the information, the adjuster to adjust an illuminance of the light from the irradiator when the irradiator irradiates another piece of the material with light based on a square of an irradiation time during which the other piece of the material is irradiated by the irradiator.

35. The apparatus according to claim 34, wherein the controller determines the illuminance by dividing the target polymerization degree by the square of the irradiation time.

36. The apparatus according to claim 34, wherein letting Ic be the illuminance of the light from the irradiator, with which the material is irradiated, tc be the irradiation time during which the material is irradiated with the light, k be a coefficient, and PD be the target polymerization degree of the material subjected to irradiation with the light, the controller determines the illuminance in accordance with:

$$PD = k \times (\sqrt{I_c}) \times tc.$$

37. An article manufacturing method comprising:
forming a film on a substrate by using an apparatus as defined in claim 17; and
processing the substrate on which the film is formed,
wherein the article is obtained from the processed substrate.

38. An article manufacturing method comprising:
forming a film on a substrate by using an apparatus as defined in claim 24; and
processing the substrate on which the film is formed,
wherein the article is obtained from the processed substrate.

39. An article manufacturing method comprising:
forming a film on a substrate by using an apparatus as defined in claim 31; and
processing the substrate on which the film is formed,
wherein the article is obtained from the processed substrate.

40. An article manufacturing method comprising:
forming a film on a substrate by using an apparatus as defined in claim 34; and
processing the substrate on which the film is formed,
wherein the article is obtained from the processed substrate.

41. A method of forming a pattern by curing a material by irradiating the material with light in a state in which a mold is in contact with the material, photochemical reaction velocity of the material being proportional to a square root of an illuminance of the light with which the material is irradiated, the method comprising:
an irradiation step of irradiating a piece of the material with light for curing the piece of the material;
an acquisition step of acquiring information regarding that the piece of the material has not been cured to be within a predetermined range for a target polymerization degree after the irradiation step has finished;
a determination step of determining, after the acquisition step, an irradiation time during which another piece of the material is irradiated with light based on the square root of the illuminance of the light; and
an irradiation step of irradiating the other piece of the material with the light for the determined irradiation time.

42. A method of forming a pattern by curing a radical polymerizable material by irradiating the material with light in a state in which a mold is brought into contact with the material, the method comprising:
an irradiation step of irradiating a piece of the material with light for curing the piece of the material;
an acquisition step of acquiring information regarding that the piece of the material has not been cured to be within a predetermined range for a target polymerization degree after the irradiation step has finished;
a determination step of determining, after the acquisition step, an irradiation time during which another piece of the material is irradiated with light based on a square root of an illuminance of the light; and
an irradiation step of irradiating the other piece of the material with the light for the determined irradiation time.

43. A method of forming a pattern by curing a material by irradiating the material with light in a state in which a mold is in contact with the material, photochemical reaction velocity of the material being proportional to a square root of an illuminance of the light with which the material is irradiated, the method comprising:
an irradiation step of irradiating a piece of the material with light for curing the piece of the material;
an acquisition step of acquiring information regarding that the piece of the material has not been cured to be within a predetermined range for a target polymerization degree after the irradiation step has finished;
an adjustment step of adjusting an illuminance of the light for irradiating another piece of the material with light based on a square of an irradiation time during which the other piece of the material is irradiated; and
an irradiation step of irradiating the other piece of the material with the illuminance adjusted in the adjustment step.

44. A method of curing a radical polymerizable material by irradiating the material with light in a state in which a mold is brought into contact with the material, the method:
an irradiation step of irradiating a piece of the material with light for curing the piece of the material;
an acquisition step of acquiring information regarding that the piece of the material has not been cured to be within a predetermined range for a target polymerization degree after the irradiation step has finished;
an adjustment step of adjusting an illuminance of the light for irradiating another piece of the material with light based on a square of an irradiation time during which the other piece of the material is irradiated; and
an irradiation step of irradiating the other piece of the material with the illuminance adjusted in the adjustment step.

* * * * *